United States Patent [19]
Bae

[11] Patent Number: 6,043,683
[45] Date of Patent: Mar. 28, 2000

[54] OUTPUT PAD CIRCUIT USING CONTROL SIGNAL

[75] Inventor: Jong-Kon Bae, Seoul, Rep. of Korea

[73] Assignee: LG Semicon Co., Ltd., Cheongju, Rep. of Korea

[21] Appl. No.: 08/931,883

[22] Filed: Sep. 17, 1997

[30] Foreign Application Priority Data

Dec. 30, 1996 [KR] Rep. of Korea ......... 96-77509

[51] Int. Cl.[7] .......... H03K 19/0185
[52] U.S. Cl. .......... 326/87; 326/30; 326/58; 326/86
[58] Field of Search .......... 326/30, 86–87, 326/83, 121, 26–27, 57–58, 17

[56] References Cited

U.S. PATENT DOCUMENTS

| | | | |
|---|---|---|---|
| 5,039,874 | 8/1991 | Anderson | 326/121 |
| 5,059,830 | 10/1991 | Tokumaru et al. | 326/86 |
| 5,621,335 | 4/1997 | Andresen | 326/87 |
| 5,677,639 | 10/1997 | Masiewicz | 326/30 |

FOREIGN PATENT DOCUMENTS

| | | | |
|---|---|---|---|
| 62-123827 | 6/1987 | Japan | 326/87 |
| 4-160920 | 6/1992 | Japan | 326/87 |

*Primary Examiner*—Jon Santamauro
*Attorney, Agent, or Firm*—Fleshner & Kim

[57] ABSTRACT

An output pad circuit is provided that adjusts a driving output current size within the chip based on a control signal. Thus, the output pad circuit adjusts a driving output current size, without attaching an external buffer or exchanging the output pad circuit, when an external load size varies during a chip design. The output pad circuit includes a tri-state inverter having an output being a tri-state level when a control signal is low level, but operating as an inverter when the control signal is high level.

26 Claims, 3 Drawing Sheets

OUTPUT PAD CIRCUIT USING CONTROL SIGNAL

BACKGROUND OF THE INVENTION

1. Field of the Invention

The present invention relates to a semiconductor device, and more particularly, to an output pad circuit.

2. Background of the Related Art

As shown in FIG. 1, a related art output pad circuit includes an inverter IN1 for inverting an input data signal Din, and a CMOS inverter IN2 receiving an output of the inverter IN1. The inverter IN2 includes a PMOS transistor P1 and an NMOS transistor N1 coupled in series between a supply voltage Vcc and a ground voltage Vss. The gates of the NMOS transistor N1 and the PMOS transistor P1 are commonly coupled and receive the output of inverter IN1. An output pad circuit as shown in FIG. 2 is identical in composition to that of FIG. 1, except for the sizes of transistors P1, P2, N1, N2, i.e., the Beta ratios thereof.

The operation of the related art output pad circuit will now be described with reference to the accompanying drawings. First, when the input data signal Din is at a high level, the output value of the inverter IN1 becomes a low level, and the PMOS transistor P1 in the CMOS inverter IN2 is turned on in accordance with the output value of the inverter IN1. Accordingly, a high level data signal Dout is outputted through an output terminal.

When the input data signal Din is at a low level, the NMOS transistor N1 In the CMOS inverter IN2 is turned on in accordance with a high level output signal of the inverter IN1. Accordingly, a low level data signal Dout is outputted through the output terminal. The operation of the output pad circuit as shown in FIG. 2 is identical to that of FIG. 1.

Thus, the output pad circuits of FIGS. 1 and 2 function identically but are differentiated by respective sizes of the transistors P1, P2, N1, N2. Thus a respective size of an output driving current is different in accordance with the size of the respective transistors. Namely, the respective driving output currents of the inverters IN2, IN3 are different because of the sizes of the transistors P1, P2, N1, N2.

In comparing the inverter IN2 of the output pad circuit in FIG. 1 and the inverter IN3 of the output pad circuit in FIG. 2, PMOS transistor P2 and NMOS transistor N2 in inverter IN3 are respectively twice the respective size of PMOS transistor P1 and NMOS transistor N1 in inverter IN2. That is, the transistors are identical in length, but the transistors P2, N2 in the inverter IN3 are twice as the large as transistors P1, N1 in the inverter IN2 in width.

In such output pad circuits, the size of the output driving current is determined in accordance with that of the output transistors so that respective output pad circuits generate a proper output driving current value. The size of the output driving current of an output pad current is determined during a chip design by an external application connected to the corresponding output pad circuit.

That is, when the load on an output pad circuit is large, there is applied an output pad circuit having a correspondingly large output driving current. However, when a load on an output pad circuit is not large, the output pad circuit employs a correspondingly lesser output driving current.

In the related art output pad circuit, when the size of the output driving current of an output pad circuit does not match with an external load, an increased operation time for an external circuit or an increased peak current value during a level transition can occur. Namely, when the size of the output driving current in an output pad circuit is small compared to an external load, it takes more time for a voltage level to the external load to be assumed. To decrease the transition time, an external buffer circuit is required, or the preset output pad circuit in a chip can be replaced by an output pad circuit having a larger output driving current.

When the size of the output driving current in the output pad circuit is larger than an external load, a peak current value at a transition level of the output pad circuit becomes large enough to generate ground bouncing. As a result, an input/output ground fluctuates so that marginal driving voltages $V_{iL}$, $V_{iH}$ in the output pad circuit can vary, which leads to an erroneous operation in the chip.

SUMMARY OF THE INVENTION

An object of the present invention is to solve at least the above-described problems and disadvantages in the related art.

Another object is to provide a control signal which controls a driving output current of an output pad circuit.

Another object of the present invention to provide an output pad circuit using a tri-state inverter control signal.

A further object of the invention is to adjust the size of the output pad circuit in a chip interior without attaching a buffer or exchanging an output pad when an external load on the output pad circuit varies, for example, during a chip design.

To achieve the above-described objects and/or advantages in whole or in part, there is provided an output pad circuit using a tri-state inverter control signal including a first PMOS transistor and a first NMOS transistor respectively coupled in series between a supply voltage and a ground voltage and having respective gates receive an input data signal from an inverter. The output pad circuit further includes an additional tri-state inverter in which when a control signal is at a low level an output value of the tri-state inverter is rendered to a tri-state level.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
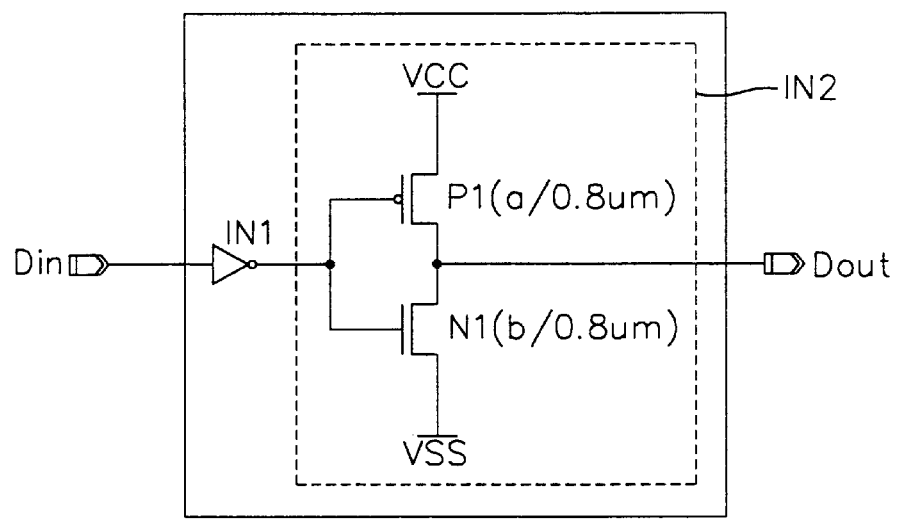
FIG. 1 is a schematic circuit diagram showing a related art output pad circuit used when a load on the output pad circuit is small.
Figure 2:
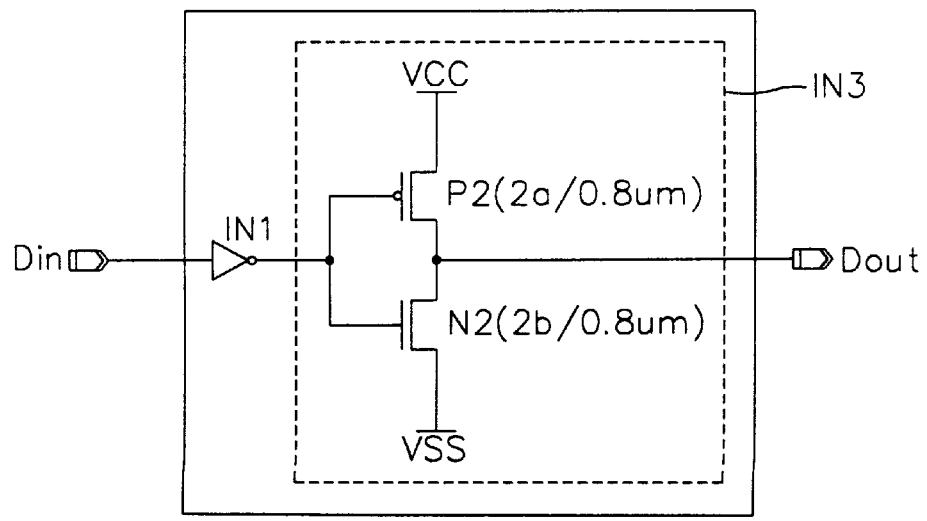
FIG. 2 is a schematic circuit diagram showing a related art output pad circuit used when a load on the output pad circuit is large.
Figure 3:
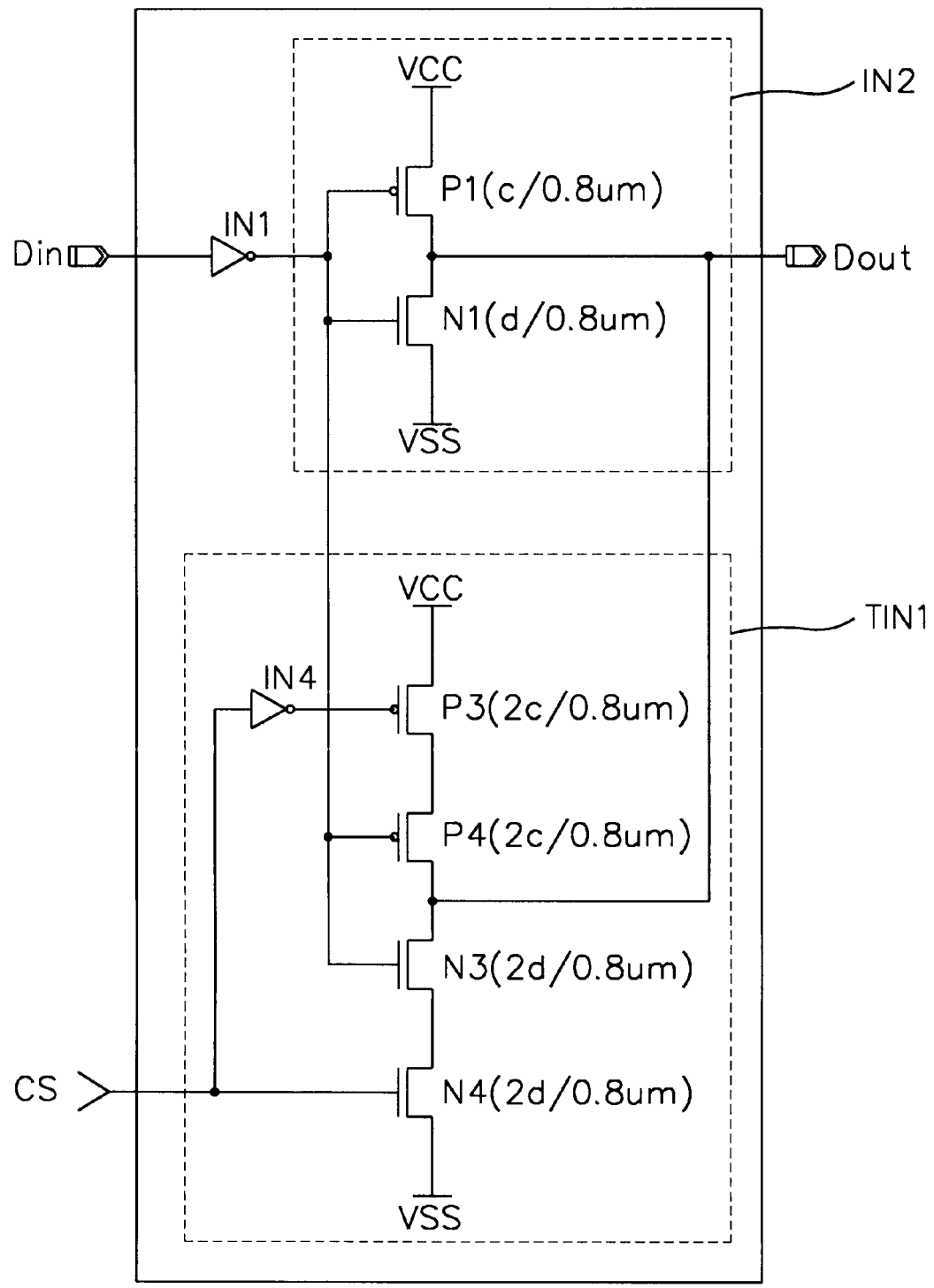
FIG. 3 is a schematic circuit diagram showing a preferred embodiment of an output pad circuit according to the present invention.

As shown in FIG. 3, an output pad circuit according to a first preferred embodiment of the present invention includes an inverter IN1; a CMOS inverter IN2 and a tri-state inverter TIN1. The CMOS inverter IN2 includes a PMOS transistor P1 and an NMOS transistor N1 having commonly coupled gates that receive an output of the inverter IN1. The PMOS transistor P1 and the NMOS transistor N1 are coupled in series between a supply voltage Vcc and a ground voltage Vss. The tri-state inverter TIN1 includes an inverter IN4, PMOS transistors P3, P4 and NMOS transistors N3, N4. The transistors P3, P4, N3, N4 are coupled in series between the supply voltage Vcc and the ground voltage Vss.

A control signal CS is applied to the gate of the PMOS transistor P3 through the inverter IN4 and to the gate of NMOS transistor N4. The output of the inverter IN1 in the output pad circuit is applied to the gates of the PMOS transistor P4 and the NMOS transistor N3. An output terminal between the PMOS transistor P4 and the NMOS transistor N3 is coupled to an output terminal in the output pad circuit. When control signal CS is at a low level, an output of the tri-state inverter TIN1 assumes a tri-state level, and when control signal CS is at a high level, tri-state inverter TIN1 serves as an inverter.

Operations of the output pad circuit according to the first preferred embodiment will now be described. When the input data signal Din is at a high level and the control signal CS is at a low level, the output value of tri-state inverter TIN1 is rendered to a tri-state level. The PMOS transistor P1 is turned on in accordance with the low level signal outputted from inverter IN1 and the output data signal Dout from inverter IN2 becomes a high level. Therefore, the size of the output driving current is determined according to the size (c/0.8 μm) of the PMOS transistor P1 in the CMOS inverter IN2.

When input data signal Din and control signal CS are both at a high level, the PMOS transistors P3, P4 in the tri-state inverter TIN1 are turned on. Further, the NMOS transistor N3 is turned off. Thus, the tri-state inverter TIN1 outputs a high level data signal Dout. Also, the output driving current is determined in accordance with the size of the PMOS transistor P1 in CMOS inverter IN2 and the size of the PMOS transistors P3, P4 in tri-state inverter TIN1.

At this time, the output driving current of the tri-state inverter TIN1 is determined by the sizes of the pair of PMOS transistors P3 and P4 which are coupled in series to equal to an output driving current of a PMOS transistor having a size of c/0.8 μm. Further, the PMOS transistor P1 in the CMOS inverter IN2 and the PMOS transistors P3, P4 in tri-state inverter TIN1 are coupled in parallel with each other. Accordingly, the output driving current becomes equal to the output driving current of a PMOS transistor having a size of 2c/0.8 μm. In other words, the output driving current is doubled.

When the input data signal Din and the control signal CS are both respectively at a low level, an output value of the tri-state inverter TIN1 is a tri-state level and an output value of inverter IN2 becomes a low level. Thus, a low level output data signal Dout is outputted through the external output terminal. At this time, the output driving current is determined by the size d/0.8 μm of the NMOS transistor N1 in the CMOS inverter IN2.

When the input data signal Din is at a low level and the control signal CS is at a high level, the output value of the CMOS inverter IN2 is a low level, and the PMOS transistors P3, P4 in tri-state inverter TIN1 are turned off. However, the NMOS transistors N3, N4 are turned on so that the CMOS inverter IN2 and the tri-state inverter TIN1 respectively together output a low level data signal Dout. Consequently, the output driving current is determined by the sizes of the NMOS transistor N1 in the CMOS inverter IN2 and the size of the NMOS transistors N3, N4 in the inverter TIN1.

At this time, the output driving current of tri-state inverter TIN1 is determined by the pair of the NMOS transistors N3, N4, which are coupled in series to equal an output driving current of an NMOS transistor of a size d/0.8 μm. In the meantime, because the NMOS transistor N1 in the CMOS inverter IN2 and the NMOS transistors N3, N4 in the tri-state inverter TIN1 are respectively coupled in series, the output driving current serves to drive an output current of an NMOS transistor of a size 2d/0.8 μm. In other words, the output driving current is doubled.

As a result, the output pad circuit according to the first preferred embodiment employs the control signal CS of the tri-state inverter TIN1 to vary the size of the output driving current. In the first preferred embodiment, the output driving current is varied between a prescribed level and double the prescribed level. However, the present invention is not intended to be limited to this. For example, the output driving current could be varied between the prescribed level and predetermined ratios of the prescribed level. Thus, an increased change with regard to an external load at a chip design stage can be handled by adjusting the size of an output driving current within the chip.

Figure 4:
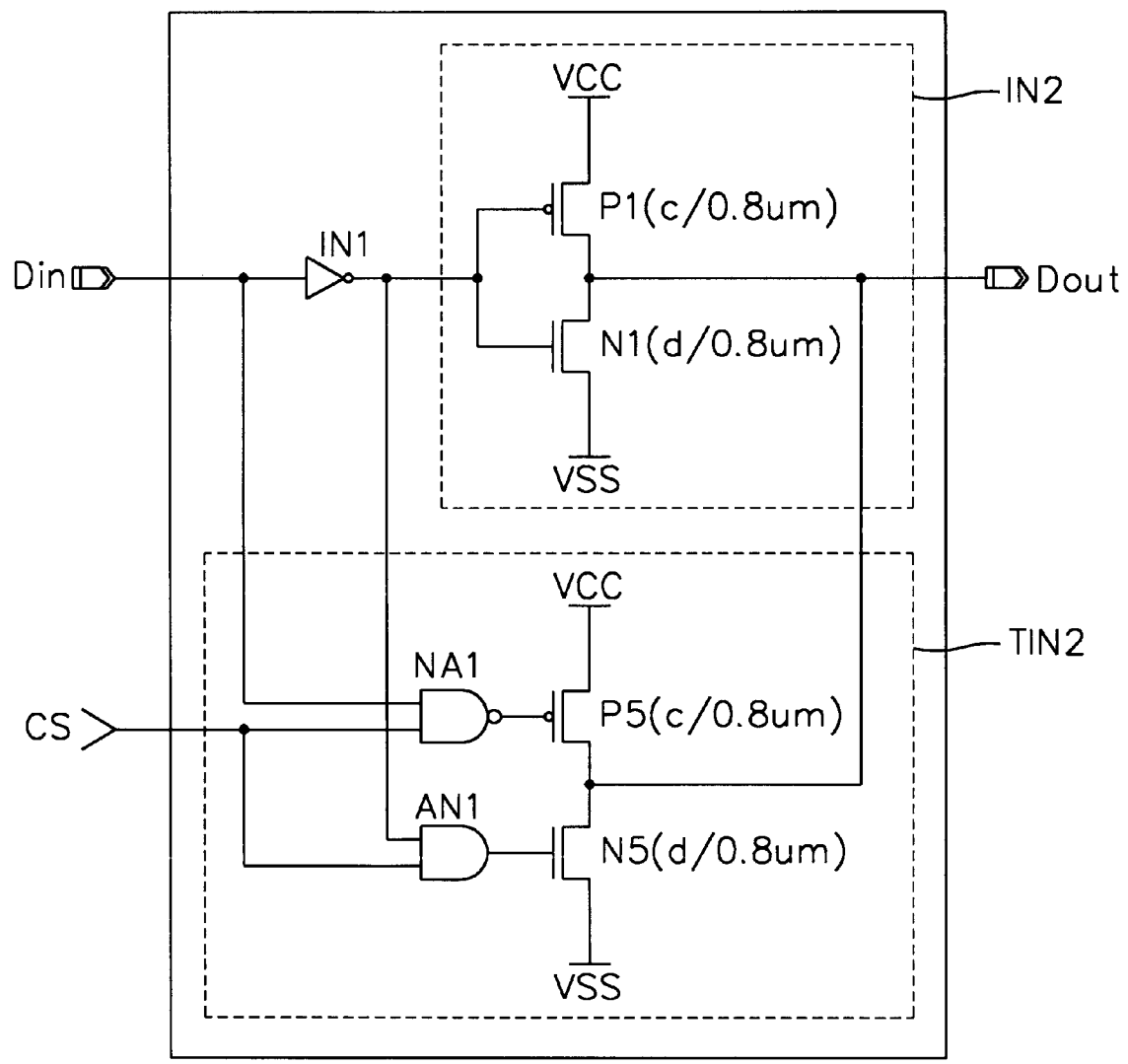
FIG. 4 is a schematic circuit diagram showing another preferred embodiment of an output pad circuit of the present invention.

As shown in FIG. 4, an output pad circuit according to a second preferred embodiment of the present invention replaces the tri-state inverter TIN1 of the first preferred embodiment with a tri-state inverter TIN2. The tri-state inverter TIN2 includes a NAND gate NA1 for NANDing the input data signal Din and the control signal CS, an AND gate AN1 for ANDing an output signal of inverter IN1 and control signal CS, a PMOS transistor P5 and an NMOS transistor N5. The PMOS transistor P5 and the NMOS transistor N5 are coupled in series between the supply voltage Vcc and the ground voltage Vss and the respective gates of which receive output values of the NAND gate NA1 and the AND gate AN1.

Operations of the output pad circuit according to the second preferred embodiment of the present invention, are similar to the first preferred embodiment. Thus, a detailed description will be omitted because the output driving current obtains similar results to the first preferred embodiment.

As described above, preferred embodiments of the output pad circuit according to the present invention employ control signals in tri-state inverters to vary a size of an output driving current. Thus, if there is a large change with regard to an external load at a chip design stage, the size of the output driving current can be adjusted within a chip to prevent an erroneous chip operation due to mismatching an output pad circuit and a corresponding external load.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An output pad circuit includes a first and second transistors coupled in series between a first potential and a second potential, wherein respective control electrodes of the first and second transistors receive an inverted input data signal, the output pad circuit further comprising:

an output node coupled to the first and second transistors to transmit an output signal; and a tri-state inverter coupled to the output node that receives a control signal and the input data signal, wherein when the output pad circuit is at steady state, a driving current of the output signal is selectable from at least three different values based on the input signal and the control signal, and wherein the output node is coupled to an external load, and the coupled external load is one of a plurality of prescribed load values, and the driving current of the output signal is selected from the at least three different values based on the coupled external load using the input and control signals.

2. The output pad circuit of claim 1, wherein the tri-state inverter comprises:

an inverter;

third through sixth third through sixth transistors coupled in series between the first potential and the second potential, wherein control electrodes of the third transistor and the sixth transistor receive different levels of the control signal, wherein respective control electrodes of the fourth transistor and the fifth transistor receive the inverted input data signal; and an output terminal between the fourth transistor and the fifth transistor is coupled to an output terminal of the output pad circuit, wherein the first and second transistors are directly connected between a supply voltage and a ground voltage, and wherein the output node is coupled to the output terminal.

3. The output pad circuit of claim 1, wherein the tri-state inverter operates as an inverter when the control signal is a high level, and wherein an output signal of the tri-state inverter is a tri-state level when the control signal is a low level.

4. The output pad circuit of claim 1, wherein the tri-state inverter comprises:

a first logic gate for logically processing the input data signal and the control signal;

a second logic gate for logically processing the inverted input data signal and the control signal; and third and fourth transistors coupled in series between the first potential and the second potential, and wherein control electrodes of the third and fourth transistors respectively receive an output value of the first logic gate and an output value of the second logic gate, wherein the first and second transistors are directly connected between a supply voltage and a ground voltage.

5. The output pad circuit of claim 1, wherein the first transistor is a PMOS transistor, the second transistor is an NMOS transistor, the first and second potentials are respectively a supply voltage and a ground voltage, and wherein the control electrode is a gate.

6. The output pad circuit of claim 1, wherein the driving current value of the output signal when the control signal is the high level is two times (2x) the driving current value when the control signal is the low level.

7. The output pad circuit of claim 1, wherein the output node coupled to a load, wherein the load is selectable between a high load and a low load, and wherein the driving current of the output signal is determined according to the selected load.

8. An internal control circuit for use with an output pad circuit that receives an input signal and outputs an output signal, the control circuit comprising a logic circuit that receives a control signal, wherein when the output pad circuit is at steady state, a driving current of the output signal of the output pad circuit is selectable from more than two different values based on the control signal applied to said internal control circuit, and wherein the logic circuit comprises a tri-state inverter that receives the control signal, wherein when the control signal is a prescribed level, the output value of the internal control circuit is a tri-state level, and wherein the tri-state inverter comprises:

a first logic gate for logically processing the input signal and the control signal;

a second logic gate for logically processing an inverted input data signal and the control signal; and third and fourth transistors coupled in series between a first potential and a second potential, and wherein control electrodes of the third and fourth transistors respectively receive an output value of the first logic gate and an output value of the second logic gate, wherein the first and second transistors are directly connected between a supply voltage and a ground voltage.

9. The internal control circuit of claim 8, wherein the tri-state inverter operates as an inverter when the control signal is a high level.

10. The internal control circuit of claim 8, wherein the first and second logic gates are respectively a NAND gate and an AND gate.

11. The internal control circuit of claim 8, wherein the selected value of the driving current when the control signal is a high level is two times (2x) a corresponding value of the driving current of the output signal when the control signal is a low level.

12. The internal control circuit of claim 8, further comprising:

an input terminal that receives the input signal;

two series coupled inverters that generate the output signal; and an output terminal that outputs the output signal.

13. A semiconductor device, comprising:

an output pad circuit responsive to an input signal at an input electrode to provide an output signal at an output pad;

a load coupled to the output pad circuit; and a control circuit coupled to said output pad circuit and responsive to a control signal such that a driving current of the output signal when the output pad circuit is at steady state is selectable from more than two different values based on the input signal and the control signal, wherein said output pad circuit includes first and second transistors directly connected in series between a supply voltage and a ground voltage and responsive to the input signal applied at the input electrode, said first and second transistors coupled to an output electrode of the output pad circuit at a common serial connection and having first and second channel length/width ratios.

14. The semiconductor device of claim 13, wherein said output pad circuit comprises:

a first inverter coupled to the input electrode; and a second inverter coupled to said first inverter and the output electrode, wherein the second inverter comprises the first and second transistors.

15. The semiconductor device of claim 14, wherein said control circuit comprises a tri-state inverter coupled to an output of said first inverter and an output of said second inverter and responsive to the control and input signals, wherein the load has one of a plurality of different prescribed load values, and wherein the selected value of the driving current is based on a corresponding one of the different prescribed load values.

16. The semiconductor device of claim 13, wherein said control circuit comprises a plurality of serially connected transistors responsive to the input signal and the control signal to select the driving current value of the output signal at the output electrode.

17. The semiconductor device of claim 13, wherein the driving current value of the output signal is selectable from four different output values based on the input signal and the control signal.

18. The semiconductor device of claim 13, wherein said output pad circuit further comprises an inverter coupled to the input electrode, each of said first and second transistors having first, second and control electrodes, said second electrodes of said first and second transistors being coupled to each other to form the common serial connection and said first electrodes of said first and second transistors being coupled for receiving first and second voltages, respectively, wherein control electrodes of said first and second transistors are commonly coupled to receive an output of said inverter.

19. The semiconductor device of claim 16, wherein
    said output pad circuit further comprises a first inverter coupled to the input electrode and said first and second transistors; and
    said serially connected transistors of said control circuit comprise third, fourth, fifth and sixth transistors of third, fourth, fifth and sixth channel length/width ratios sequentially coupled in series, each having first, second and control electrodes, the control electrodes of said fourth and fifth transistors being coupled to an output of said first inverter and the second electrodes of said fourth and fifth transistor being coupled to the output electrode, said third and sixth transistors being responsive to the control signal.

20. The semiconductor device of claim 19, wherein said control circuit further comprises a second inverter coupled to receive the control signal and an output of said second inverter being coupled to the control electrode of said third transistor and the control electrode of said sixth transistor coupled to receive the control signal.

21. The semiconductor device of claim 16, wherein
    said output pad circuit further comprises a first inverter coupled to the input electrode and said first and second transistors; and
    said control circuit includes first and second logic units, each coupled for receiving the control signal, said first logic unit receiving the input signal and said second logic unit receiving an output of said first inverter, wherein
    said serially connected transistors of said control circuit comprises third and fourth transistors of third and fourth channel length/width ratios, each having first, second and control electrodes, the second electrodes of said third and fourth transistors being coupled to the output electrode, said control electrode of said third transistor being coupled to receive an output of said first logic unit and said control electrode of said fourth transistor being coupled for receiving an output of said second logic unit.

22. The semiconductor device of claim 20, wherein each of said third and fourth channel length/width ratios is greater than said first channel length/width ratio, and each of said fifth and sixth channel length/width ratios is greater than said second channel length/width ratio.

23. The semiconductor device of claim 21, wherein said third and fourth channel length/width ratios are greater than said first and second channel length/width ratios, respectively.

24. A circuit, comprising:
    an output pad circuit responsive to an input signal at an input electrode to provide an output signal at an output terminal;
    a load coupled to the output terminal; and
    a control circuit coupled to said output terminal and responsive to a control signal such that a driving current of the output signal when the circuit is at steady state is selectable from more than two different values based on the input signal and the control signal, wherein the load has one of a plurality of different prescribed load values, and wherein the selected value of the driving current is based on a corresponding one of the different prescribed load values the input signal and the control signal.

25. The circuit of claim 24, wherein the control circuit includes a tri-state inverter that comprises:
    a first logic gate for logically processing the input signal and the control signal;
    a second logic gate for logically processing the inverted input signal and the control signal; and
    third and fourth transistors coupled in series between the first potential and the second potential, and wherein control electrodes of the third and fourth transistors respectively receive an output value of the first logic gate and an output value of the second logic gate.

26. The circuit of claim 24, wherein said output pad circuit comprises:
    a first inverter coupled to the input electrode; and
    a second inverter coupled to said first inverter and the output electrode, and wherein said second inverter comprises first and second transistors directly connected in series between a first potential and second potential, wherein respective control electrodes of the first and second transistors receive the input signal.

* * * * *